United States Patent
Yagi et al.

(10) Patent No.: US 6,192,204 B1
(45) Date of Patent: Feb. 20, 2001

(54) CONTROL METHOD AND CIRCUIT FOR TRANSFER CURRENT, AND PRINTER HAVING THE CONTROL CIRCUIT

(75) Inventors: Chiaki Yagi, Inagi; T. Nakashima, Kawasaki, both of (JP)

(73) Assignee: Fujitsu Limited, Kawasaki (JP)

( * ) Notice: Under 35 U.S.C. 154(b), the term of this patent shall be extended for 0 days.

(21) Appl. No.: 09/453,802

(22) Filed: Dec. 3, 1999

(30) Foreign Application Priority Data

Dec. 7, 1998 (JP) .................................................. 10-347419

(51) Int. Cl.[7] .......................... G03G 15/14; H01H 23/00; H01G 23/00
(52) U.S. Cl. ................................. 399/66; 361/235; 399/89
(58) Field of Search ................................ 399/66, 88, 89; 361/214, 225, 235

(56) References Cited

U.S. PATENT DOCUMENTS

| | | | | |
|---|---|---|---|---|
| 4,042,874 | * | 8/1977 | Quinn et al. | 361/225 X |
| 4,166,690 | * | 9/1979 | Bacon et al. | 399/89 |
| 4,305,651 | * | 12/1981 | Umezawa et al. | 399/89 |
| 4,728,880 | * | 3/1988 | Walgrove | 361/235 X |
| 5,182,603 | * | 1/1993 | Yamada | 361/214 X |
| 5,369,472 | * | 11/1994 | Raj et al. | 399/88 X |
| 5,682,575 | * | 10/1997 | Komori | 399/66 |
| 6,021,286 | * | 2/2000 | Kawai et al. | 399/66 X |

\* cited by examiner

*Primary Examiner*—Fred L. Braun
(74) *Attorney, Agent, or Firm*—Armstrong, Westerman, Hattori, McLeland & Naughton

(57) ABSTRACT

It is an exemplified object of the present invention to provide a transfer-current control circuit that may reduce the smaller number of current control circuits and wires than the conventional while maintaining the controllable number of currents. The present invention divides the transfer output circuit into main and auxiliary controller modules. The main controller module has a configuration similar to the conventional transfer output circuit. The auxiliary controller module provides the same number of current control circuits as the number of input signal lines. The main controller module is connected to the auxiliary controller module in a wired-OR manner. A method of controlling the transfer-current control circuit based on first and second parameters forms part of the invention.

9 Claims, 10 Drawing Sheets

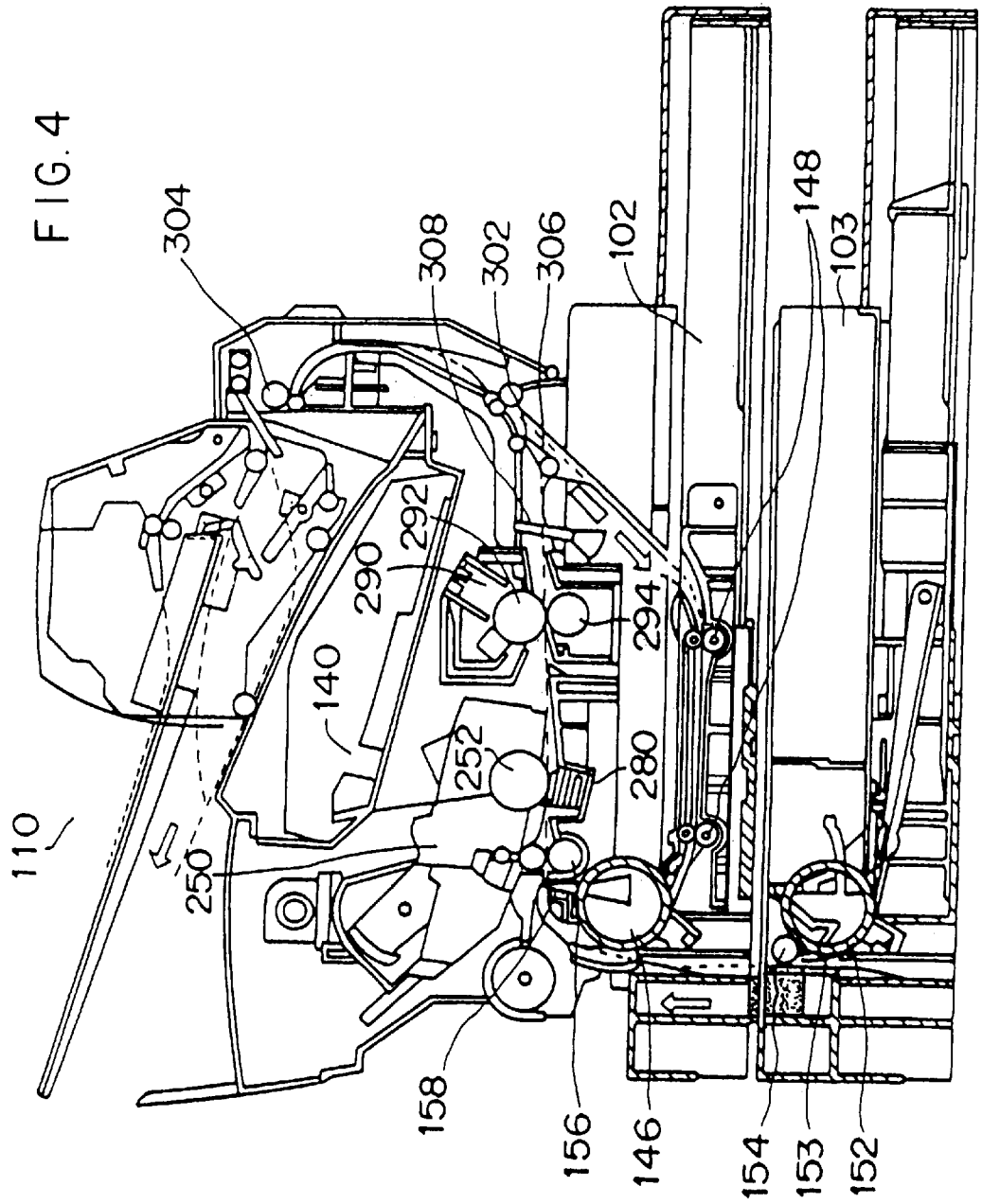

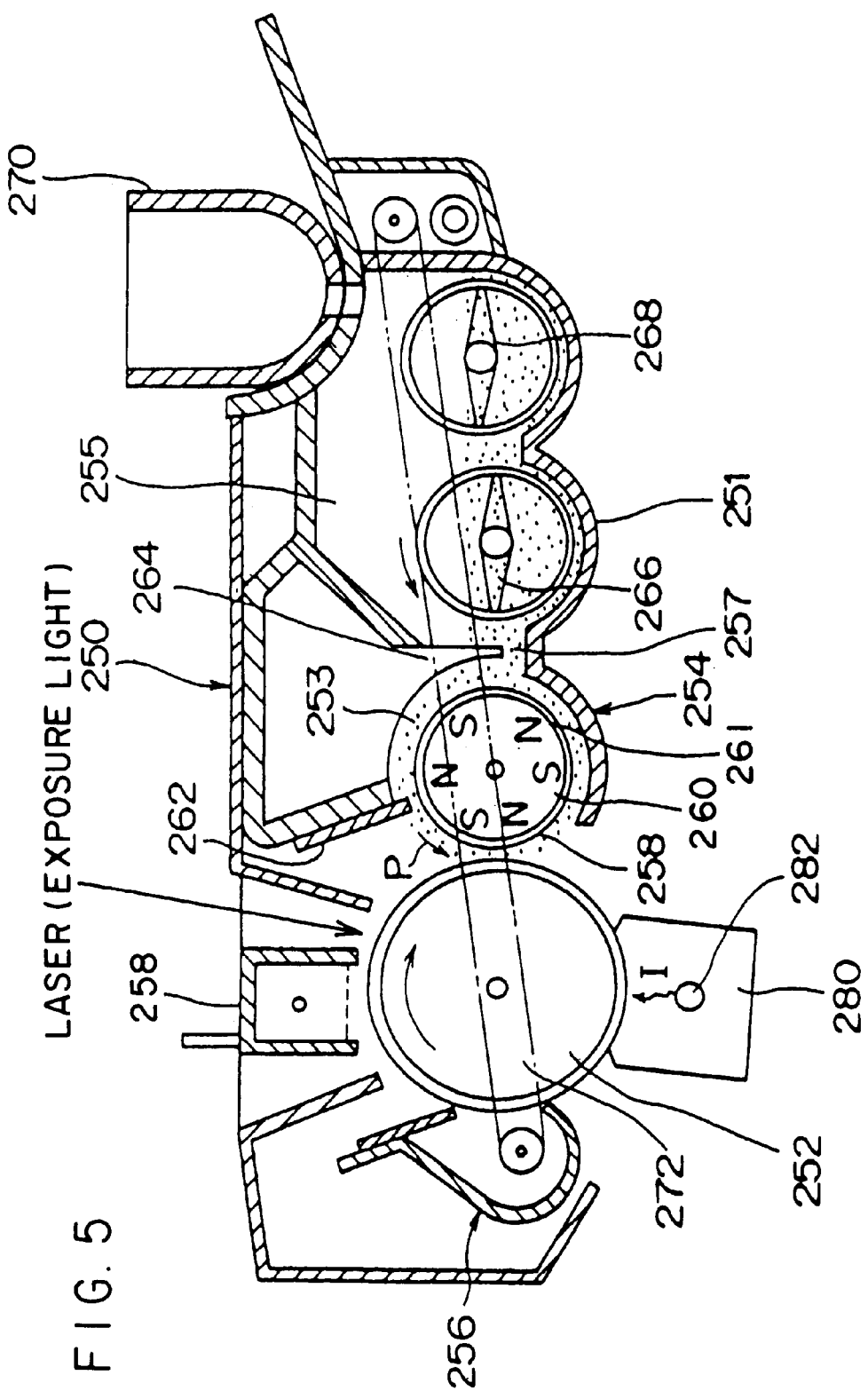

CONTROL METHOD AND CIRCUIT FOR TRANSFER CURRENT, AND PRINTER HAVING THE CONTROL CIRCUIT

BACKGROUND OF THE INVENTION

The present invention generally relates to transfer units for use with electrophotographic printers, and more particularly to a control over a transfer current which a transfer unit outputs. The present invention is suitable, for example, for a transfer unit in an electrophotographic printer. A printer according to the present invention is widely applicable not only to a single printer unit but also to those copiers, facsimile machines, computer systems and word processors, and combination machines thereof which have a print function.

An electrophotographic printer typically includes a photosensitive drum and transfer portion. A printing paper passes between the photosensitive drum and transfer portion. The photosensitive drum is charged by a pre-charger, exposed by a laser, and provided with a toner image on its surface by the development. The transfer portion typically utilizes a corona wire to apply a transfer current onto a printing paper using a corona discharge. The transfer portion attracts and attaches the toner image onto the printing paper using the transfer current, thereby completing a transfer of the toner image onto the printing paper.

A transfer current value should be adjusted according to a paper size (width), a printing-paper feed speed, a print environment (such as surrounding temperature and humidity), a printing-paper resistance (which differs according to different paper manufacturers and different paper types, e.g., thick and thin papers), print modes including single-sided (or anopisthographic) and double-sided (or duplex) prints. This is because an excessively small transfer current would insufficiently attract toner onto a printing paper for a desired transfer while an excessively large transfer current would deteriorate a printing quality by an unequal potential distribution.

Conventionally, n signal lines and $2^n$ current control circuits have determined the transfer current. The current control circuit, as used herein, refers to a circuit that determines a target transfer current value and an essential part in the transfer circuit. Two signal lines, for instance, identify four states, such as, for example, [0, 0], [0, 1], [1,0] and [1,1] in response to digital signals 0 and 1. Information on these signal lines is eventually fed to current control circuits nos. 1 through 4. The current control circuits nos. 1 through 4 respectively store different four types of transfer current values VT1 through VT4. For example, the current control circuit no. 1 corresponds to [0,0], and outputs VT1 as a transfer current for the signal [0,0].

However, there are many parameters necessary to control the transfer current as mentioned above, and a transfer current value to be changed differs every factor. Thus, four (i.e., VT1 through VT4) is insufficient for the number of transfer currents to be generated in the above example. Although it is conceivable to increase the number of signal lines and current control circuits by the number of desired transfer current values to supplement the insufficient number of producible transfer current values, such a configuration would result in the increased wiring number, the difficult packing and/or an expensive printer.

SUMMARY OF THE INVENTION

Accordingly, it is an exemplified general object of the present invention to provide a novel and useful transfer-current control method and circuit and a printer having such a control circuit in which the above disadvantages are eliminated.

Another exemplified and more specific object of the present invention is to provide a transfer-current control method and circuit and a printer having such a control circuit that may reduce the number of current control circuits and wires while maintaining the controllable number of currents.

In order to achieve the above objects, an output circuit of one aspect of the present invention which controls a current comprises a main controller module connected to a first signal line, an auxiliary controller module connected to a second signal line, an oscillator module connected to the main and auxiliary controller modules, and a transformer module connected to the main and auxiliary controller modules and oscillator module, wherein the main controller module includes a first current-switching circuit which receives a first signal through the first signal line, and a plurality of first current control circuits each of which is selected by the first current-switching circuit based on the first signal, and outputs a first value, the number of first current control circuits being $2^m$ where the number of the first signal lines is m, wherein the auxiliary controller module includes a second current-switching circuit which receives a second signal through the second signal line, and a second current control circuit which is selected by the second current-switching circuit based on the second signal, and outputs a second value, and wherein where the number of first and second signal lines is n, the number of the second current control circuits is s, and s=n−m, the number of first and second current control circuits is ($2^{2\ n-s}$+s), the transformer module consequently being able to generate and output $2^n$ currents using a combination of the first and second values.

A high-voltage power-supply unit of one aspect of the present invention comprises a transfer output circuit which controls a transfer current applied to a transfer unit in order to print a predetermined image on a printing paper, and a pre-charger output circuit which controls a pre-charger. The transfer output circuit comprises the above output circuit of the present invention. The pre-charger output circuit receives a signal indicative of a feed speed of the printing paper, and generates pre-charge voltage applied to the pre-charger. The second signal includes the signal indicative of the feed speed.

A printer of one aspect of the present invention includes a photosensitive body, a transfer unit that transfers onto a printing paper a toner image that has been formed on the photosensitive body, and the above transfer output circuit that controls transfer current applied to the transfer unit.

A control method of one aspect of the present invention comprises the steps of reading out, while referring to a set table, control value based on a control instruction including first and second parameters, the set table including the first and second parameters, the first parameter including $2^m$ types of first elements, and the number of types of second parameter being s each of which includes two types of second elements, and identifying the first and second elements corresponding to the control value and set the first and second elements as first and second signals respectively, wherein the first signal is supplied to a main controller module including $2^m$ first control circuits through m first signal lines, while the second signal is supplied to an auxiliary controller module including s second control circuits through s second signal lines.

A mechanical-part control circuit module of one aspect of the present invention comprises a memory which stores a set table including first and second parameters, the first parameter including $2^m$ types of first elements, and the number of types of second parameter being s each of which includes two types of second elements, a processor which not only reads out a control value based on a control instruction including the first and second parameters while referring to the set table stored in the memory, but also identifies the first and second elements corresponding to the control value thereby setting the first and second elements as first and second signals respectively, wherein the mechanical-part control circuit module is connected to main and auxiliary controller modules, wherein the first signal is supplied to the main controller module including $2^m$ first control circuits through m first signal lines, and the second signal is supplied to the auxiliary controller module including s second control circuits through s second signal lines, whereby the main and auxiliary controller modules output the control value based on the first and second signals.

A control device of one aspect of the present invention comprises a main controller module connected to a first signal line, and an auxiliary controller module connected to a second signal line, wherein the main controller module includes a first switching circuit which receives a first signal through the first signal line, and a plurality of first control circuits each of which is selected by the first switching circuit based on the first signal, and outputs a first value, the number of first controllers being $2^m$ where the number of the first signal lines is m, wherein the auxiliary controller module includes a second switching circuit which receives a second signal through the second signal line, and a second control circuit which is selected by the second switching circuit based on the second signal, and outputs a second value, and wherein where the number of first and second signal lines is n, the number of the second controllers is s, and s=n−m, the number of first and second control circuits is ($2^{n-s}$+s), the control device being able to generate and output $2^n$ combinations of the first and second values.

A control device of one aspect of the present invention comprises a main controller module connected to a first signal line, an auxiliary controller module connected to a second signal line, and a logic module connected to the main and auxiliary controller modules, the logic module performing a predetermined operation for outputs of the main and auxiliary controller modules, wherein the main controller module includes a first switching circuit which receives a first signal through the first signal line, and a plurality of first control circuits each of which is selectable by the first switching circuit based on the first signal, and outputs a first value, the number of first controllers being $2^m$ where the number of the first signal lines is m, wherein the auxiliary controller module includes a second switching circuit which receives a second signal through the second signal line, and a second control circuit which is selected by the second switching circuit based on the second signal, and outputs a second value, and wherein where the number of first and second signal lines is n, the number of the second controllers is s, and s=n−m, the number of first and second control circuits is ($2^{n-s}$+s), the logic module being consequently able to generate and output $2^n$ combinations of the first and second values.

The output circuit, high-voltage power-supply unit, and printer having the output circuit as a transfer output circuit divide the number of input signal lines into first and second signal lines. Only m first signal lines are connected to the main controller module having $2^m$ current control circuits, the remaining s second signal lines are connected to the auxiliary controller module having s current control circuit.

Although the present invention requires only ($2^m$+s) current control circuits whereas the main controller module requires if connected to n (=m+s) signal lines, $2^n$ current control circuits. Thus, the present invention reduces the number of current control circuits by $2^n-(2^m+s)=2^m(2^s-1)>0$. Nevertheless, the number of controllable transfer current values is $2^n$, and the present invention maintains the controlling advantages.

The control device according to the present invention is applicable to control current, voltage, and other values in addition to the transfer current, and becomes simple in circuit configuration when using a wired OR arrangement.

Other objects and further features of the present invention will become readily apparent from the following description of the embodiments with reference to accompanying drawings.

BRIEF DESCRIPTION OF DRAWINGS

FIG. 4 is a sectional view showing an internal configuration in the printer shown in FIG. 2.

FIG. 5 is an enlarged sectional view around print and transfer units in the printer shown in FIG. 4.

DETAILED DESCRIPTION OF PREFERRED EMBODIMENTS

Figure 1:
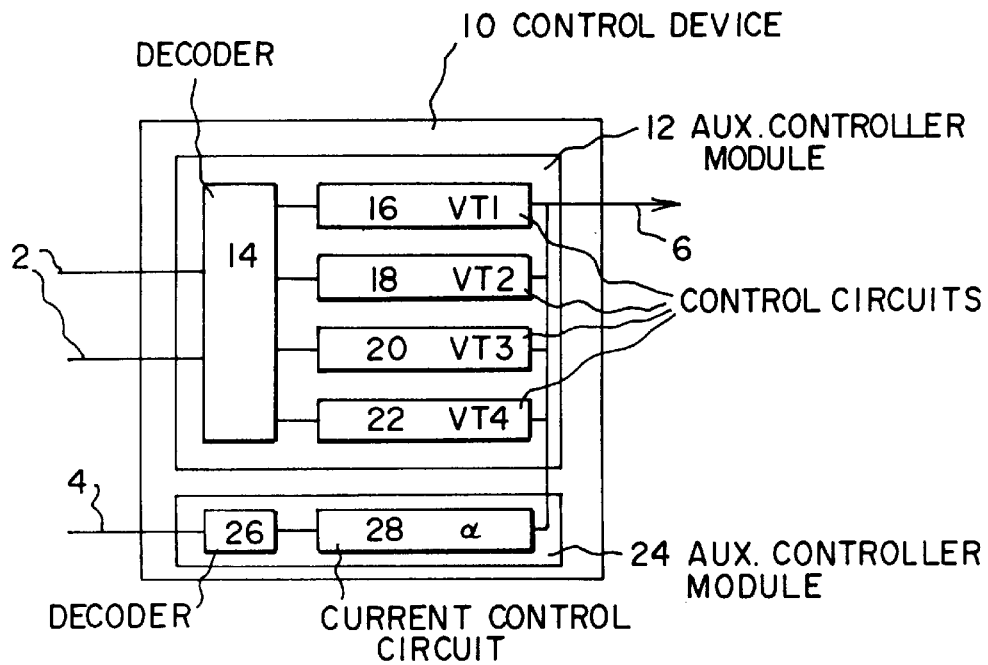
FIG. 1 is a block diagram for explaining a principle of a control circuit according to the present invention.

A description will now be give of a principle of control device 10 of one aspect according to the present invention, with reference to FIG. 1. As conceptually shown in FIG. 1, the control device 10 according to the present invention includes main and auxiliary controller modules 12 and 24, is connected to first and second signal lines 2 and 4, and generates single output 6.

In FIG. 1, the main controller module 12 is connected to two first signal lines 2 and includes four current control circuits 16 through 22 for illustration purposes. In general, the main controller module 12 is connected to n first signal lines 2 and includes $2^n$ current control circuits. Similarly, the auxiliary controller module 24 is connected to single second signal line 4 and includes one current control circuit 28 for illustration purposes, but the number of second signal lines and auxiliary current control circuits is not limited. Reference numerals 14 and 26 each denote a decoder.

The current control circuits 16 through 22 and 28 include resistors that may set predetermined current values VT1 through VT4 and á, respectively, and the decoders 14 and 26 each serve as a switch. In FIG. 1, the first signal line 2 selects one of the current control circuits 16 through 22, while the second signal line 4 determines a selection of the current control circuit 28. When the auxiliary controller module 24 includes a plurality of current control circuits, the second signal line 4 may select one or the arbitrary number of current control circuits as described later with reference to FIG. 9.

The first signal lines 2 each receive a switch signal (i.e., digital signal) indicative of "0" and "1" (or "ON" and "OFF" or "H (high level)" and "L (Low Level)"), and may generate four states of [0,0], [0,1], [1,0] and [1,1]. When these four states correspond to the current control circuits 16 through 22, the current control circuit 16 corresponds to [0,0], and outputs the transfer current VT1 for the signal [0,0]. Hereupon, suppose that VT1 through VT4 are 10 $\mu$A, 20 $\mu$A, 30 $\mu$A, and 40 $\mu$A.

Similarly, the second signal line 4 receives a switch signal (i.e., digital signal) indicative of "0" and "1". The switch signal "0" when supplied to the second signal line 4 would not select the current control circuit 28, and consequently one of VT1 through VT4 would become the output 6. The switch signal "1" when supplied to the second signal line 4 would select the current control circuit 28, and the auxiliary controller module 24 outputs a. Hereupon, suppose that á is 5 $\mu$A. In this manner, the first signal line 2 always selects one of the current control circuits 16 through 22, whereas the second signal line 4 may or may not select the current control circuit 28.

An output of the auxiliary controller module 24 is connected in parallel to the main controller module 12 and may form the output 6 as a result of addition (wired OR) to one of the current control circuits 16 through 22. Optionally, the adder (not shown) may be provided outside the main and auxiliary controller modules 12 and 14 and supplied with these outputs. Notably, such an adder, if replaced with another logic operator such as a subtracter and a multiplier, would serve to increase the number of types of outputs 6. Therefore, such a logic operator is within the scope of the present invention, as described later with reference to FIG. 11.

Turning back to FIG. 1, it is understood that the output 6 may have eight combinations using the first and second signal lines 2 and 4 as shown in Table 1 below.

TABLE 1

| First Signal Line 2 | Second Signal Line 4 | Output 6 |
| --- | --- | --- |
| 0,0 | 0 | VT1 (10 $\mu$A) |
| 0,1 | 0 | VT2 (20 $\mu$A) |
| 1,0 | 0 | VT3 (30 $\mu$A) |
| 1,1 | 0 | VT4 (40 $\mu$A) |
| 0,0 | 1 | VT1 + á (15 $\mu$A) |
| 0,1 | 1 | VT2 + á (25 $\mu$A) |
| 1,0 | 1 | VT3 + á (35 $\mu$A) |
| 1,1 | 1 | VT4 + á (45 $\mu$A) |

Conventionally, three first signal lines 2 and the main controller module 12 having $2^3$ (=8) current control circuits have generated these eight transfer current values without using the auxiliary controller module. Such a configuration, however, would result in the increased number of wires between the decoder and respective current control circuits in the main controller module, causing the complex packing.

In addition, the conventional configuration needs $2^n$ current adjustments for the respective current control circuits to obtain a necessary output current value.

In contrast, the inventive control device 10 includes the auxiliary controller module 24, and increases the number of types of outputs 6 by the number produced by multiplying the number of current control circuits in the auxiliary controller module 24 by the number of current control circuits in the main controller module 12. For example, as the main controller module 12 includes four current control circuits while the auxiliary control circuit 24 includes one current control circuit, four outputs are added to four outputs generated by the main controller module 12. The total number of current control circuits decreases down to five whereas the above conventional configuration requires eight. Although the present invention thus reduces the number of wires and current adjustments, it maintains the same effects as the conventional configuration having eight controllable current control circuits.

As an exemplified concrete use of the output 6 in Table 1, VT1 through VT4 are transfer current values used as a transfer current for paper widths A through D at speed H, and VT1+á through VT4+á are used as a transfer current for the paper widths A through D at speed F.

In this way, the present invention provides the auxiliary controller module 24 if necessity arises without changing the configuration of the main controller module 12. As mentioned above, a transfer current value should be adjusted according to various parameters including a printing-paper feed speed and a print environment (such as a surrounding temperature and humidity). If only the main controller module 12 handles all of these changes, the increased wiring number would result in an expensive printer. In contrast, the present invention holds down the printer cost.

The control device 10 of the present invention is suitable for but not limited to a transfer-current control device, as described later.

Figure 2:
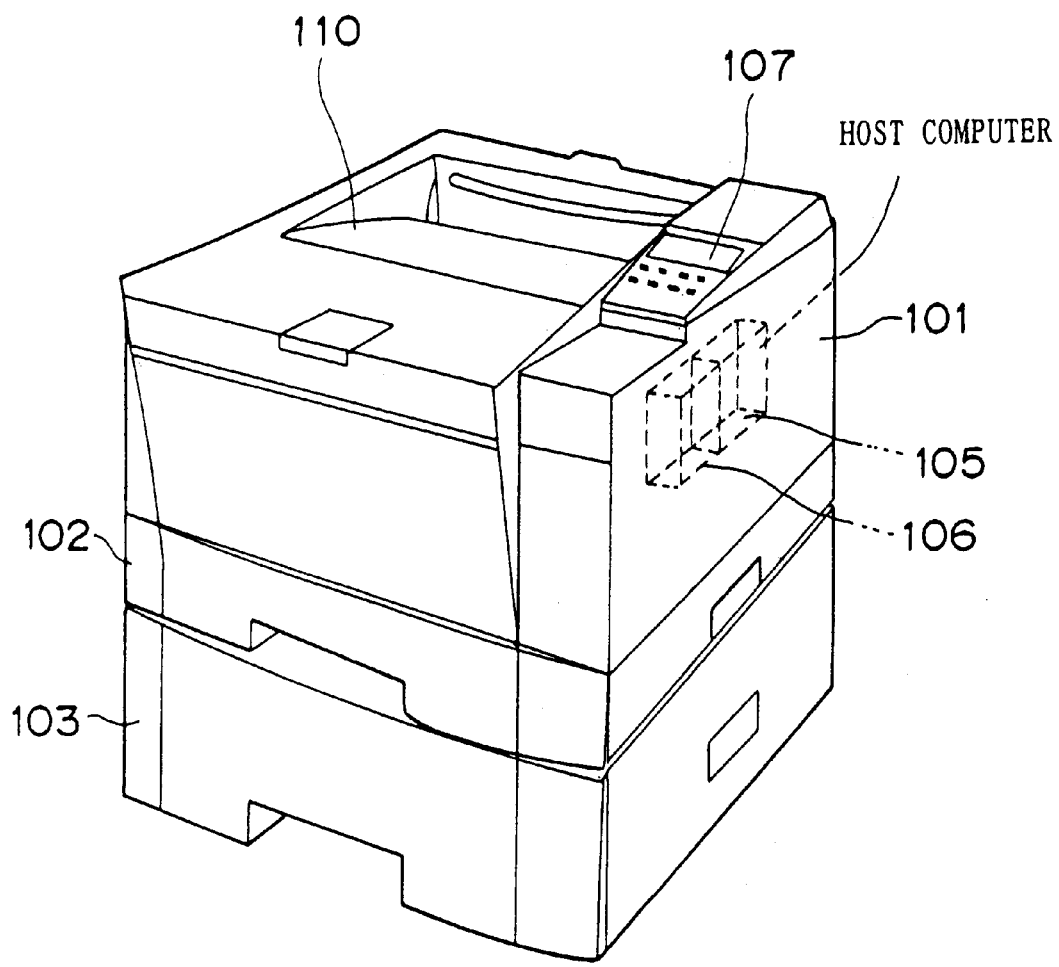
FIG. 2 is a schematic perspective view of an exemplified printer according to the present invention.

FIG. 2 shows a schematic perspective view of exemplified printer 100 according to the present invention. The inventive printer 100 includes operational panel 107 and stacker 110 on the body 100, and double-sided print unit 102 and single-sided first paper supply print unit 103 at the lower part in the body 100. There are provided controller 105, mechanical-part control circuit module 106, and various image forming units in the body 100. The controller 105 and mechanical-part control circuit module 106 are conceptually shown by broken lines, but they are mounted on the same motherboard or on different boards. A user may perform various known setups for the printer 100 using the operational panel 107, for example, making it into an on-line or off-line.

If necessary, the printer 100 may expand under the first paper-supply unit 103 one or more paper supply units for storing printing papers different in size and kind (thick and regular papers) than the first paper-supply unit 103, so as to save an arduous exchange of a paper in the paper supply units 102 and 103 with a desired paper.

The controller 105 is connected via a known printer cable and interface (not shown) provided at the rear surface of the body 100 to a host computer including a personal computer, a network such as a LAN, and other external devices. The controller 105 develops print information sent from the host computer, into video data, for example, in a bitmap format, and sends the video data to the mechanical-part control circuit module 106. The controller 105 may employ any structure known in the art, and a description thereof will be omitted.

The mechanical-part control circuit module 106 generates a switch signal necessary for the inventive transfer current control device to control it as described later. As discussed in detail below, a switch signal changes according to a selection of either double-sided print unit 102 or the first paper-supply unit 103, or a kind of printing paper, such as a regular or thick paper. The mechanical-part control circuit module 106 controls a mechanical part (or unit) in the body.

Figure 3:
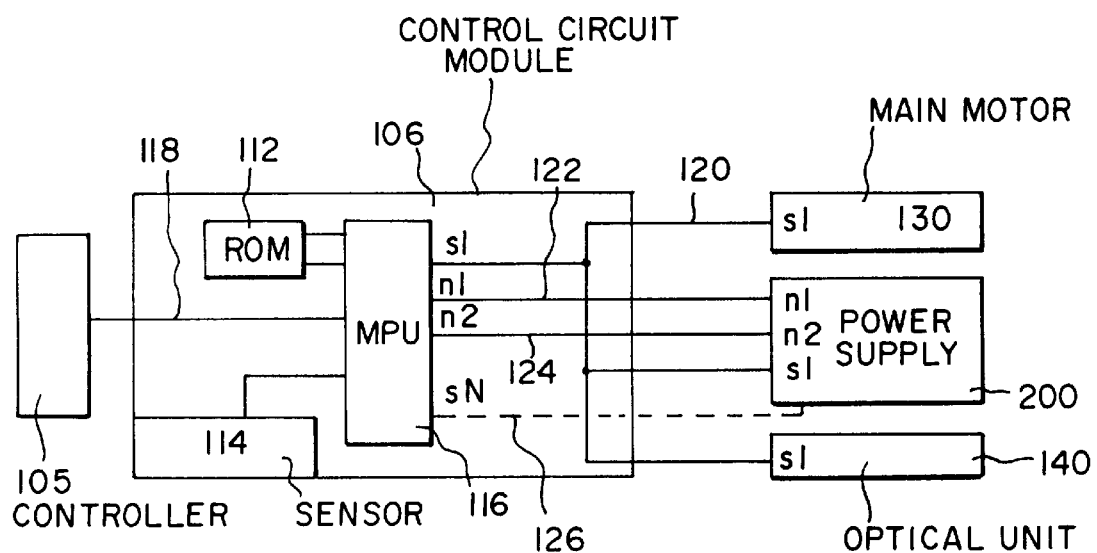
FIG. 3 is a block diagram for explaining a mechanical-part control circuit module in the printer shown in FIG. 2.

A detailed description will be given of the controller 105, mechanical-part control circuit module 106 and other units, with reference to FIG. 3. Hereupon, FIG. 3 is a block diagram for explaining a structure and operation of the mechanical-part control circuit module 106.

The mechanical-part control circuit module 106 includes the ROM 112, various sensors 114, and MPU 116. The mechanical-part control circuit module 106 is connected to the controller 105 via signal line 118, and receives video data (print data) in a bitmap formal, for example, from the signal line 118. The mechanical-part control circuit module 106 is connected to main motor 130, optical unit 140, and high-voltage power-supply unit 200 via signal lines 120 through 124. The MPU 116 may supply the desired number of signals to the high-voltage power-supply 200 when the number of parameters for changing the transfer current increases. Such an embodiment will be discussed with reference to FIGS. 8 and 9. In FIG. 3, "sN" generalizes these other signals and the signal line is represented by "126". The inventive control device 10 that has been described with reference to FIG. 1 is arranged in the high-voltage power-supply unit 200 as described later.

The ROM 112 stores as a program instruction to each unit and set data including a condition, and MPU 116 operates in accordance with the program stored in the ROM 112. Various sensors 114 are comprised of temperature sensor, humidity sensor, or other sensors or connected to their outputs, and these outputs are supplied to the MPU 116. A temperature sensor, humidity sensor or other sensors may employ any structure known in the art, and a description thereof will be omitted.

The MPU 116 obtains resultant outputs from various sensors as well as print data including information on paper size (width), kind (such as thick and regular papers, a paper made of a different manufacturer), and a resolution, and generates various control signals in accordance with the program stored in the ROM 112. More specifically, the MPU 116 controls logic of each of the signal lines 120 through 126, thereby controlling a print operation. FIG. 3 only shows signals n1, n2 and s1 for illustration purposes.

The signals n1 and n2 each are a switch signal that adjusts a transfer current to the high-voltage power-supply unit 200, and signal lines 122 and 124 correspond to first and second signal lines 2 and 4 shown in FIG. 1. FIG. 3 only shows signal lines 122 and 124 for illustration purposes, but "n" is not limited to 2 as with FIG. 1.

The signal s1 switches a speed of the main motor 130, a voltage in the pre-charger in the high-voltage power-supply unit 200 which will be described later, and a resolution for the optical unit 140. The signal s1 is branched in the mechanical-part control circuit module 106, and output to each unit. As described later, the main motor 130 drives a printing-paper feed system, and a speed of the main motor 130 determines the printing-paper feed speed. The optical unit 140 includes an exposure light source (i.e., laser) as described later.

A further detailed description will now be given of the main controller module 130, optical unit 140, and high-voltage power-supply unit 200, with reference to FIGS. 4 and 5. FIG. 4 is a section showing the internal structure in the printer 100. FIG. 5 is an enlarged section near the print unit 250 and transfer unit 280. The high-voltage power-supply unit 200 controls the print unit 250 and transfer unit 280, and the transfer-current control device of the present invention also controls transfer current 1 which the transfer unit 280 generates. The print unit 250 forms a toner image to be transferred onto a printing paper, and the transfer unit 280 transfers the formed toner image onto the printing paper.

As best shown in FIG. 5, the print unit 250 includes photosensitive drum 252, developer 254, cleaner 256, and corona charger 258, and is detachably installed into the body 101. The photosensitive drum 252 and cleaner 256 are integrated into one component, and the developer 254 is inserted detachably into this component.

The housing 251 in the print unit 250 has an opening at its top surface. The corona charger 258 is attached at the opening, and the optical unit 140 exposes the photosensitive drum 252 through the opening. The photosensitive drum 252 is made, for example, of a function-separation type organic photosensitive body applied by a thickness of about 20 $\mu$m onto an aluminum drum, and has an outer diameter, for example, of 30 mm, rotating at a speed of 70 mm/s in the arrow direction. The corona charger 258 is a scorotron charger, and uniformly charges the surface of the photosensitive drum 252 by –600 V.

The optical unit 140 exposes the uniformly charged photosensitive drum 252, forming a latent image of –50 V through –100 V on the photosensitive drum 252. The developer 254 having development roller 259 then develops the latent image, and forms a toner image on the photosensitive drum 252. The development roller 259 includes fixed magnetic pole 258 having a plurality of magnetic poles, and sleeve 260 that rotates around the fixed magnetic pole 258. Only the sleeve 260 rotates in the direction P in the drawing, and feeds a development agent to the development area opposite to the photosensitive drum 252.

In order to supply toner stably to the photosensitive drum 252, doctor blade 262 restricts a layer thickness of the development agent on the development roller 259. Thereby, the height of the magnetic brush formed on the development roll 259 is made uniform. The magnetic brush when contacting the latent image on the photosensitive drum 252 would allow toner to be attracted onto the surface of the photosensitive drum 252 to develop it.

Carrier chamber 253 is defined by the housing 251, doctor blade 262, partition 264, and development roll 259. The carrier chamber 253 stores a development agent made of a blend of carrier and toner. Toner chamber 255 that merely stores toner is provided next to the carrier chamber 253. The toner chamber 255 includes rotatable first and second agitators 266 and 268 that feed toner in the toner chamber 255 to the carrier chamber 253 via toner inlet 257. These agitators 266 and 268 maintain the toner density in the carrier chamber 253.

The toner cartridge 270, which is installed detachably onto the developer 254, supplements toner to the developer 254. A user may supplement toner chamber 255 by exchanging with a new toner cartridge the current one which is short of toner.

The cleaner 256 contacts the photosensitive drum 252 and scratches off the residual toner from it after the transfer process so as to clean its surface. The residual toner that cleaner 256 has collected is fed back to the toner chamber 255 in the developer 254 by toner feedback mechanism 272.

The toner supplied from toner cartridge 270 and the residual toner fed back from the toner feedback mechanism 272 are blended together uniformly by the agitators 266 and 268.

A paper is fed from left to right in FIG. 4 but right to left in FIG. 5 in the print unit 250.

The transfer unit 280 faces the photosensitive drum 252 via a printing paper. This transfer unit 280 employs a well-known transfer unit using corona (discharge) wire 282. The transfer unit 280 applies with the corona wire 282, voltage from a surface opposite to the print surface of a printing paper that has reached a transfer position, thereby attaching a toner image formed on the photosensitive body 252 onto the printing paper so as to transfer the image to it. Current I flowing from the corona (transfer) wire 282 to the photosensitive drum 252 is referred to as a transfer current.

The transfer current I should be adjusted by various parameters including a printing-paper feed speed for a proper transfer of a toner image onto a printing paper and a high-quality image formation.

Figure 6:
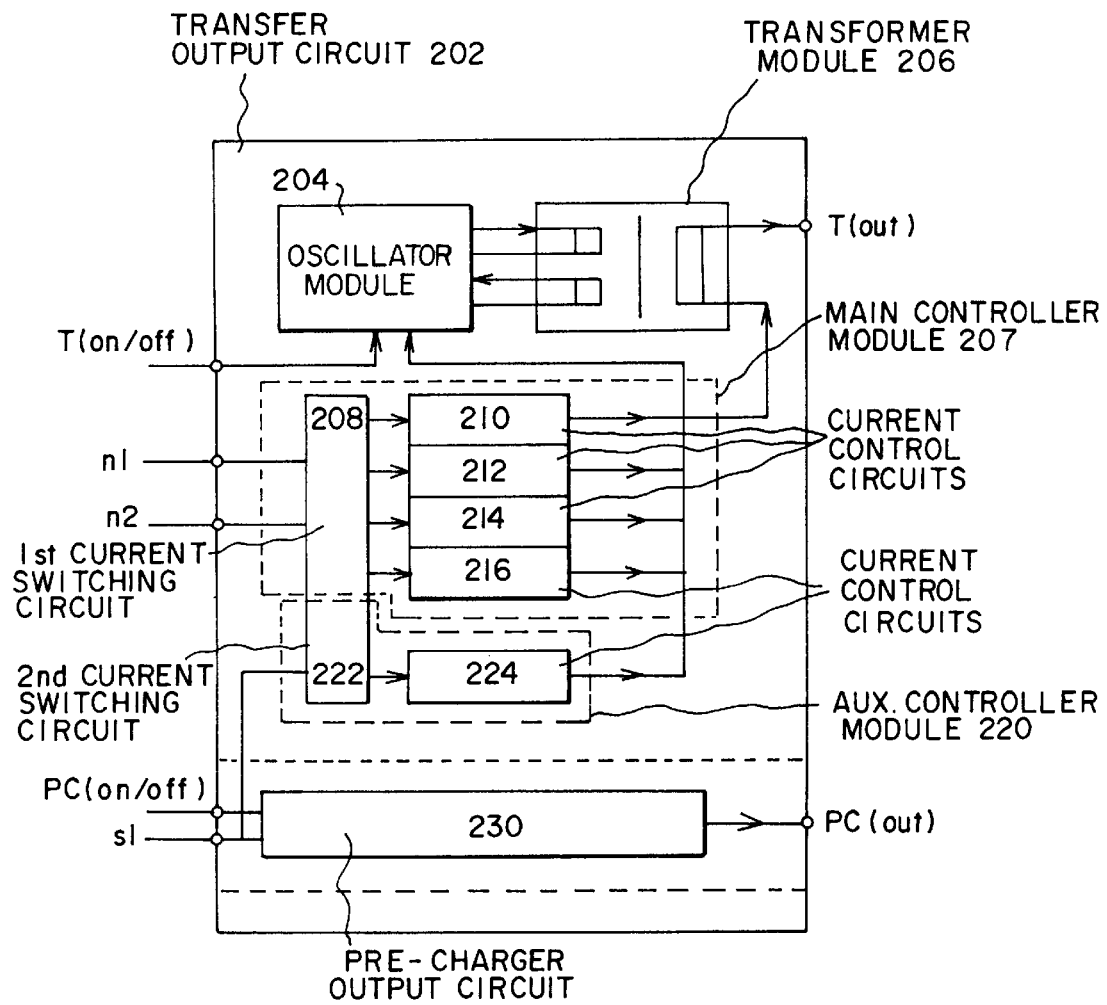
FIG. 6 is an exemplified block diagram of a high-voltage power-supply unit shown in FIG. 3.

With reference to FIG. 6, a description will be given of the high-voltage power-supply unit 200 of the present invention. As illustrated, the high-voltage power-supply unit 200 includes transfer output circuit 202 and pre-charger output circuit 230. The high-voltage power-supply unit 200 may include an additional circuit (for instance, a development output circuit).

The transfer output circuit 202 includes oscillator module 204, transformer module 206, first and second current switching circuit 208 and 222, a plurality of current control circuits 210 through 216 and 224. In particular, the main controller module 207 including elements 208 through 216 corresponds to the main controller module 12 shown in FIG. 1, while the auxiliary controller module 220 including elements 222 and 224 corresponds to the auxiliary controller module 24 shown in FIG. 1. Therefore, the first current switching circuit 208 corresponds to the decoder 14 shown in FIG. 1, and the current control circuits 210 through 216 correspond to the current control circuits 16 through 22 shown in FIG. 1. The second current switching circuit 222 corresponds to the decoder 26 shown in FIG. 1, and the current control circuit 224 corresponds to the current control circuit 28 shown in FIG. 1. The number of current control circuits included in the main and auxiliary controller modules 207 and 220 is not limited as with those in FIG. 1. The first and second current switching circuits 208 and 222 may be integrated into the corresponding current control circuits.

The oscillator module 204 receives on/off signal T(on/off) that determines whether transfer output T(out) is to be output. The MPU 116 shown in FIG. 3 may generate the signal T(on/off). The oscillator module 204 receives as a DC input an output of the main controller module 207 (and that of the auxiliary controller module 220 ) and generates as an oscillation output the transfer output T(out) together with the transformer module 206. The oscillator 204 may use any of well-known self-excited, external and parameter oscillators.

The pre-charger output circuit 230 receives pre-charge output on/off signal PC(on/off) and speed switch signal s1, and generates pre-charger output PC(out) to be applied to the charger. The present invention characteristically employs to switch the transfer current value the speed switch signal s1 that has been originally used for the pre-charge output circuit 230. Although the transfer output circuit 202 thus needs a signal line which supplies the speed switch signal s1 to the auxiliary controller module 220 which will be described later, the high-voltage power-supply unit 200 is made of a one board and a manufacture of the high-voltage power-supply unit 200 would not be affected by the increased number of signal lines. No signal line for directly supplying the speed switch signal s1 to the auxiliary controller module 220 is provided between the high-voltage power-supply unit 200 and MPU 116. It is understood that such a signal line disadvantageously influences a circuit packing step in comparison with a preferable configuration according to the present invention.

As shown in FIGS. 3 and 6, the main controller module 207 receives transfer current switch signals n1 and n2 via the signal lines 122 and 124. The auxiliary controller module 220 receives the speed switch signal s1 via the signal line 120. Those five current control circuits 210 through 216 and 224 control the oscillator module 204 so that the transfer current T(out) may become constant.

A description will be given of transfer current set process 1000 of one embodiment according to the present invention, which the MPU 116 may execute, with reference to FIGS. 3, 6 and 7. As a premise, the ROM 112 performs a simulation at the time of manufacturing of the printer 100, and stores in advance transfer current values ("set table") shown in Table 2 which is necessary to select feed speeds F and H and paper widths A through D of a printing paper. Actual values of VT1 through VT4 and á are not limited to those shown in Table 2. Of course, VT1 through VT4 need not arrange in the order from A through D in case of speed H. In FIG. 6, the current control circuits 210 through 216 may output current values VT1 through VT4, and the current control circuit 224 may output the current value á.

TABLE 2

|  | Speed F | Speed H |
| --- | --- | --- |
| Paper Width A | VT1 | VT1 + á |
| Paper Width B | VT2 | VT2 + á |
| Paper Width C | VT3 | VT3 + á |
| Paper Width D | VT4 | VT4 + á |

The ROM 112 preferably stores a signal logic table shown in the following Table 3. The signal logic table indicates a combination of signals n1, n2 and s1 necessary for the transfer circuit 202 (i.e., main and auxiliary controller modules 207 and 220) to generate the transfer current values shown in Table 2. The signal logic table shown in Table 3 is a mere example, and an arbitrary combination of signals n1, n2 and s1 may be assigned to the transfer current values.

TABLE 3

| Output Mode | n1 | n2 | s1 |
| --- | --- | --- | --- |
| VT1 | H | H | L |
| VT2 | L | H | L |
| VT3 | H | L | L |
| VT4 | L | L | L |
| VT5 = VT1 + á | H | H | H |
| VT6 = VT2 + á | L | H | H |
| VT7 = VT3 + á | H | L | H |
| VT8 = VT4 + á | L | L | H |

In setting a transfer current value, the MPU 116 determines the printing-paper feed speed F or H based on, for example, the print data fed from the controller 105 (step 1002). The speed H when selected would set the speed switch signal s1 to be a high level "H", whereas the speed F when selected would set the speed switch signal s1 to be a low level "L" (step 1002 and 1004).

Subsequent or prior to or simultaneous with the step 1002, the MPU 116 determines the printing-paper size (width)

such as A4, B5, etc. based on, for example, the print data fed from the controller 105 (step 1006).

Although two signal lines n1 and n2 may select four types of paper widths, the signal s1 selects only two types of feed speeds F and H. Therefore, the step 1002 serves as a step of selecting one of two types. In general, a binary signal is supplied to each signal line, but the present invention is not limited to four types of paper widths and two types of feed speeds. For example, two types of signal (for instance, s1 and s2) may be supplied to the auxiliary controller module 220 for four types of feed speeds, and the auxiliary controller module 220 then may include two additional current control circuits. The main controller module 207 may be connected to three signal lines and include eight current control circuits for eight types of paper widths. Nevertheless, this and following embodiments discuss parameters including four types of paper sizes and two types of options for illustration purposes.

The MPU 116 calculates and determines the feed speed and paper width, a transfer current value with reference to Table 2, and a combination of signals n1 and n2 necessary to generate the transfer current value with reference to Table 3. Thereby, the MPU 116 sets respective signals n1, n2 and s1 (step 1010), and sends them to the high-voltage power-supply unit 200 as shown in FIG. 3.

Figure 10:
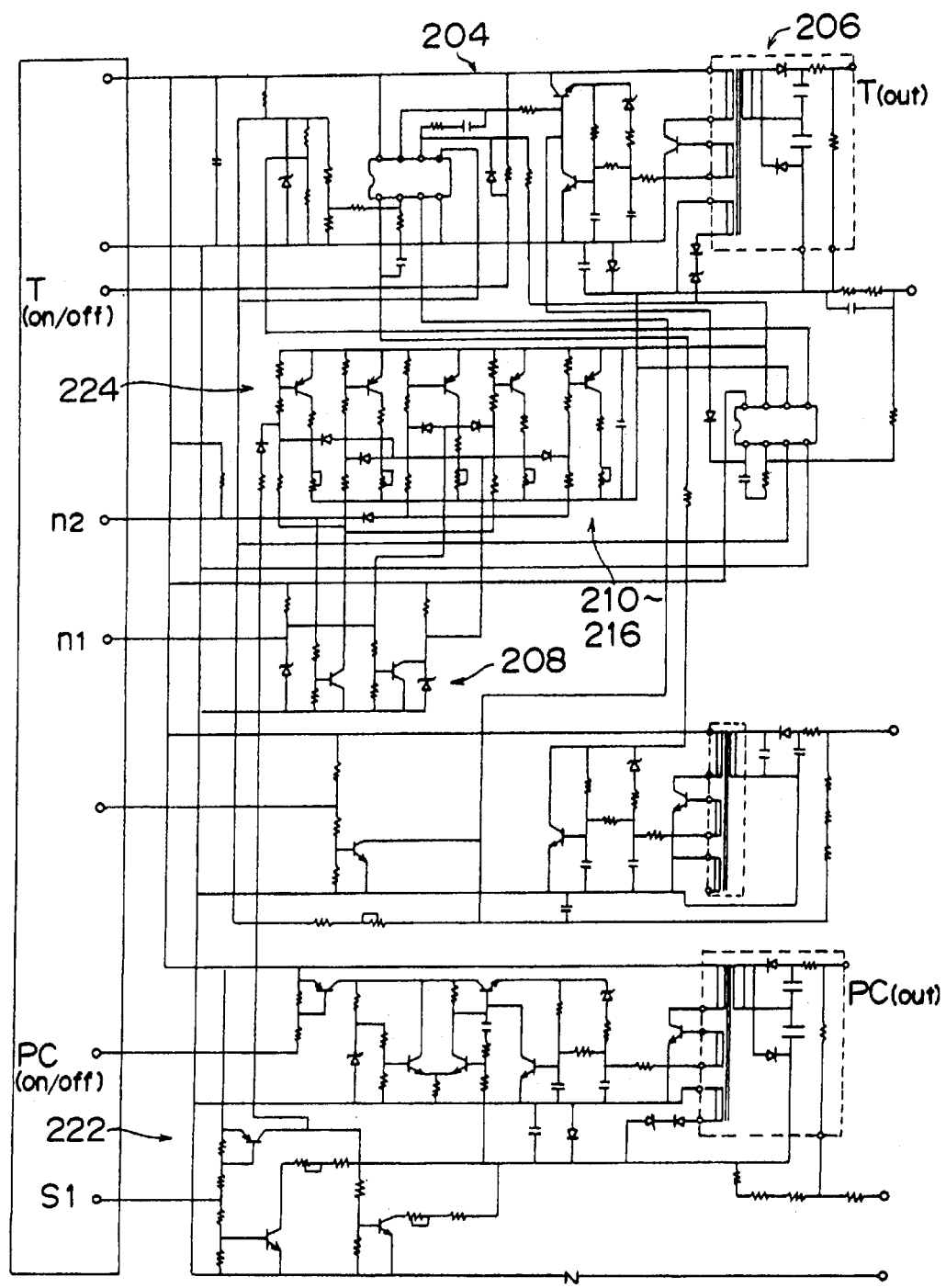
FIG. 10 is a circuit diagram including a concrete circuit configuration of a circuit shown in FIG. 6.

FIG. 10 shows a circuit diagram of a concrete circuit version of that shown in FIG. 6. FIG. 10 schematically shows reference numerals for illustration purposes.

A description will now be given of another transfer current set process 2000 of the present invention, which the MPU 116 shown in FIG. 3 may execute, with reference to FIGS. 8 and 9. According to the instant embodiment, the set table of transfer current values shown in Table 4, for example, has been produced and stored in the ROM 112. As each of parameters including speed H, thick paper, rear surface and an environment is independent, it is noted that $VT2+\acute{a}+\hat{a}+\ddot{a}$ is required for a thick paper having the width B fed at the speed H under a special environment. More specifically, VT1 through VT4 at a column of speed F in Table 4 mean a transfer current for a regular printing paper fed at the speed F under a normal environment so that its front surface may be printed. In other words, the speed F means a regular paper, front surface and normal environment.

TABLE 4

|  | Speed F | Speed H | Thick Paper | Rear Surface | Special Environment |
|---|---|---|---|---|---|
| Paper Width A | VT1 | VT1 + $\acute{a}$ | VT1 + $\hat{a}$ | VT1 + $\bar{a}$ | VT1 + $\ddot{a}$ |
| Paper Width B | VT2 | VT1 + $\acute{a}$ | VT1 + $\hat{a}$ | VT1 + $\bar{a}$ | VT1 + $\ddot{a}$ |
| Paper Width C | VT3 | VT1 + $\acute{a}$ | VT1 + $\hat{a}$ | VT1 + $\bar{a}$ | VT1 + $\ddot{a}$ |
| Paper Width D | VT4 | VT1 + $\acute{a}$ | VT1 + $\hat{a}$ | VT1 + $\bar{a}$ | VT1 + $\ddot{a}$ |

The signal logic table similar to Table 3 is stored in the ROM 112. The total number of signal lines is six, the signal logic table includes $2^{n=6}=64$ combinations of transfer current values. That signal logic table is not reproduced for convenience, but those skilled in the art would easily produce it referring to Table 3 by the disclosure of this application.

Figure 8:
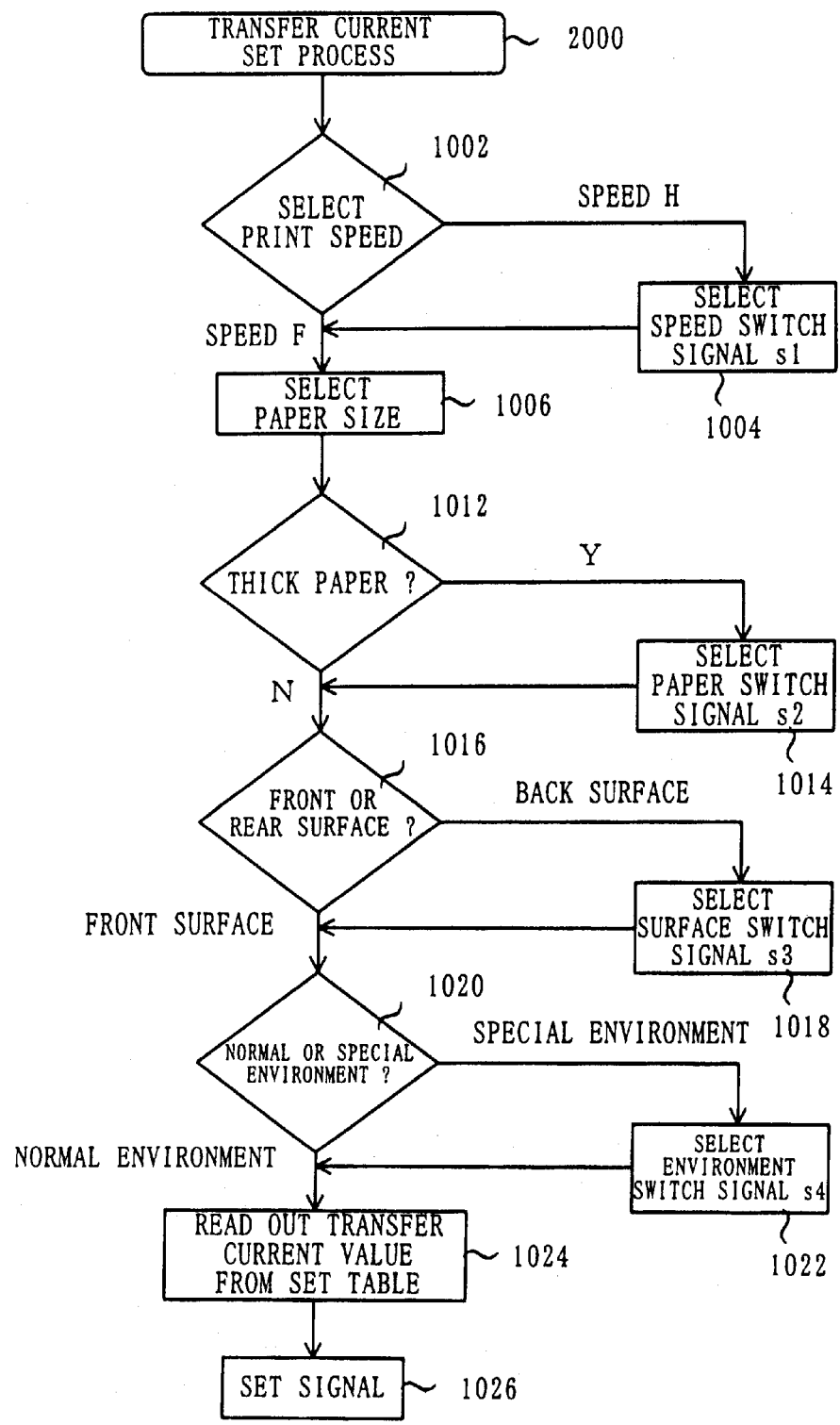
FIG. 8 is a flowchart of another transfer-current set process of one embodiment according to the present invention, which an MPU in the mechanical-part control circuit module shown in FIG. 3 may execute.
Figure 9:
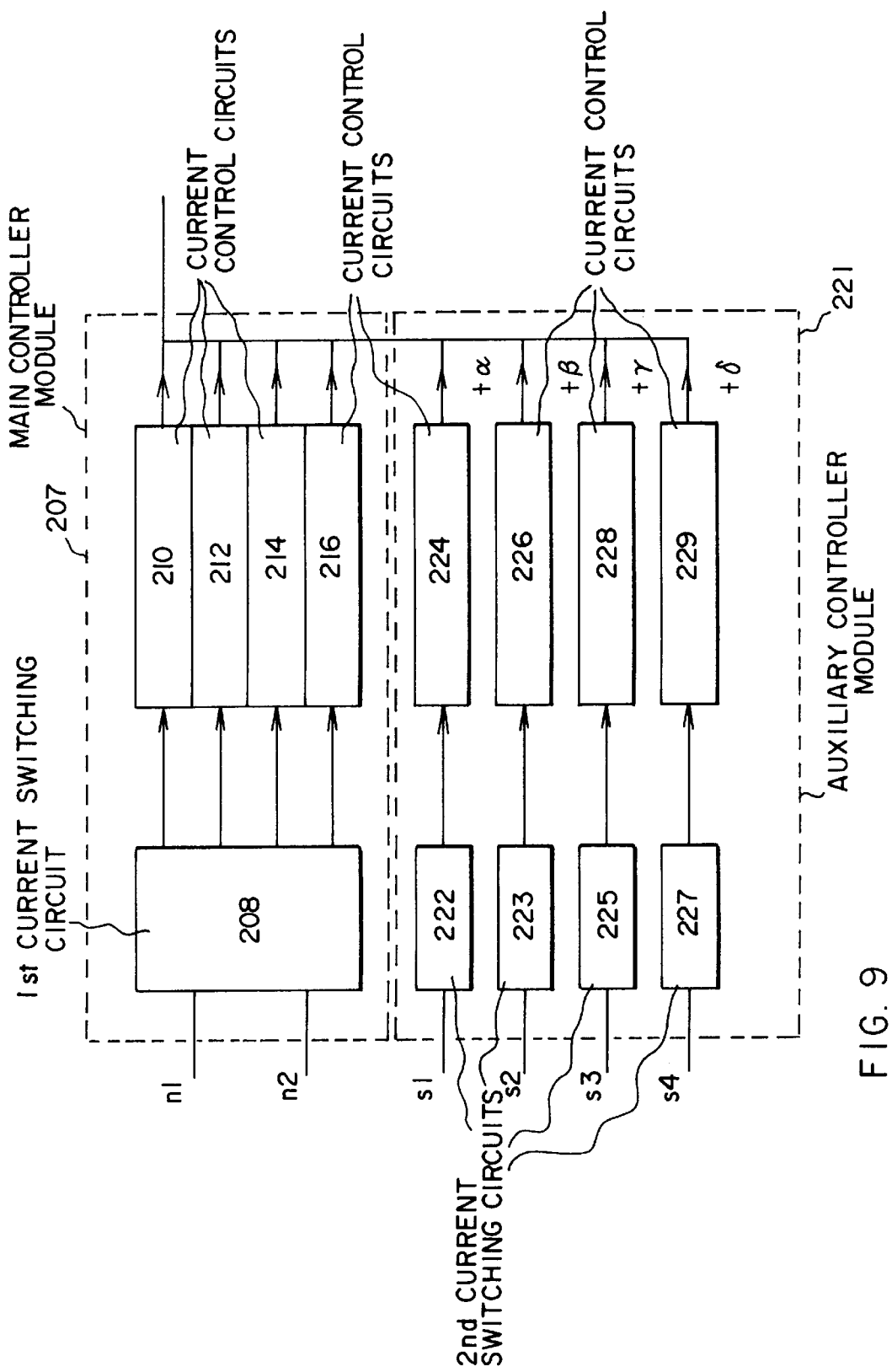
FIG. 9 is a block diagram showing the main and auxiliary controller modules usable for the process shown in FIG. 8.

FIG. 8 is a flowchart of transfer-current set process of the instant embodiment, and FIG. 9 is a block diagram showing the main and auxiliary controller modules 207 and 221 usable for the instant embodiment. Information on whether a paper in step 1012 in FIG. 8 is a thick paper is included in the print data from the controller 105 or directly entered by a user using the operational panel 107. A front or rear surface on the paper is judged by step 1016 so that an initial print surface of a printing paper that is supplied from the first paper-supply unit 103 may be the front surface, and a print surface that is subsequently supplied from the double-sided print unit 102 may be the rear surface. Information on whether it is normal or special environment judged by step 1020 is included in outputs from various sensors 114 (such as temperature sensor, humidity sensor and other environment detection sensors).

The MPU 116 selects paper switch signal s2 when judging the printing paper to be a thick paper in the step 1012 (step 1014), and selects surface switch signal s3 when judging the printing paper to be a rear surface (step 1018). The MPU 116 selects environment switch signal s4 when judging that an environment of the printer 100 (actually a transfer environment of a printing paper) is a special environment (for instance, which exceeds an allowable temperature and/or humidity) (step 1020). "s4" generalizes all the environmental factors. In this case, sN shown in FIG. 3 indicates s2 through s4.

Figure 7:
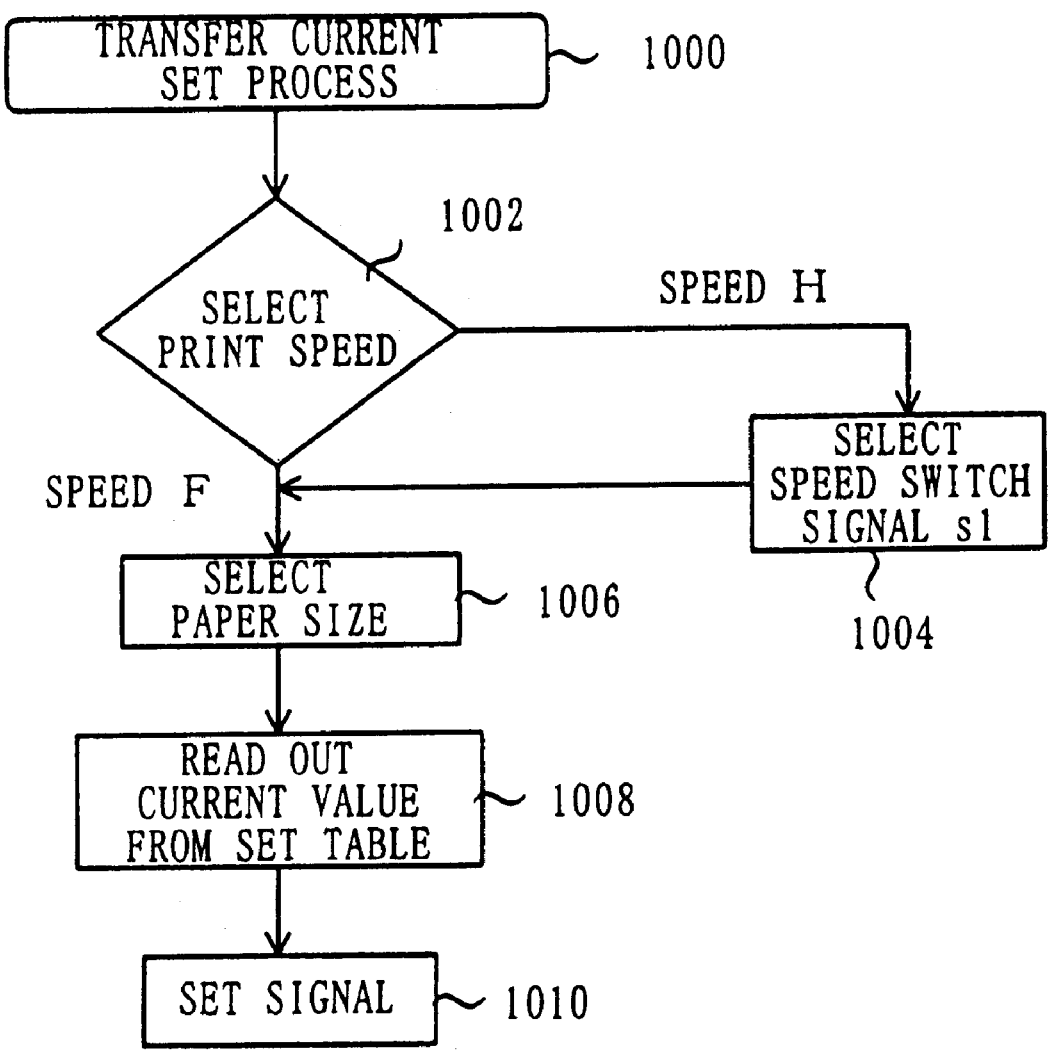
FIG. 7 is a flowchart of a transfer-current set process of one embodiment according to the present invention, which an MPU in the mechanical-part control circuit module shown in FIG. 3 may execute.

The MPU 116 then reads out, similar to the steps 1008 and 1010 shown in FIG. 7, a proper transfer current value from the set table (step 1024), and sets a signal from the signal logic table (step 1026). One of the current control circuits 224 through 229 corresponding to a selected one of the switch signals s1 through s4 outputs a value ($\acute{a}$ through $\ddot{a}$) stored in it.

The control method according to the present invention thus selects as first parameter(s) (for instance, a paper size) one or more parameters from among plural types of parameters upon which a transfer current depends, and arranges them in a column for each element (for instance, paper widths A through D). Then, the inventive control method arranges as second parameter(s) the above plural types of parameters except for the first parameter(s) in a row for each element (for instance, speed H, thick paper etc.), thereby producing the set table as shown in Tables 2 and 4. The main controller module receives a first signal indicative of the first parameter, while the auxiliary controller module receives a second signal indicative of the second parameter. Since each signal is binary, it is preferable that the first parameter includes two or more elements (for instance, four paper widths A through D) and the second parameter includes two elements (for instance, speeds F and H).

The number of types of current values to be adjusted in this embodiment is eight, which corresponds to the total number of used current control circuits. If it is assumed that the auxiliary controller module includes s current control circuits, the total number of signal lines to be input to the auxiliary controller module becomes s. If it is assumed that the main controller module is connected to m signal lines and the total number of signal lines connected to the main and auxiliary controller modules is n (=s+m), the main controller module comes to include $2^m$ current control circuits. In this case, the total number of current control circuits to be adjusted becomes ($2^m$+s) or ($2^{n-s}$+s).

The number of transfer current values becomes 64 that the transfer output circuit (ie., the main and auxiliary controller modules 207 and 221) of the present invention may produce. $2^n$ transfer currents may be producible for n signal lines.

The present invention may use the main control module as it is without changing the conventional configuration. It is sufficient to change only the auxiliary controller module when the number of parameters that affect the transfer-current value increases. $2^n$ current control circuits is needed for the main controller module including n (=m+s) signal lines, whereas the present invention only requires ($2^m$+s) current control circuits. When the total number of both current control circuits are compared, it is noted that the present invention reduces the number of the current control circuits (and signal lines each of which connects the current control circuit and a decoder) by $2^n-(2^m+s)=2^m(2^s-1)-s>0$. Advantageously, the number of controllable transfer current values is maintained to be $2^n$.

Referring to FIG. 4, when a user instructs the printer 100 to perform printing using a host computer, the controller 105 lunges a printing paper one by one from the first paper-supply unit 103 using pick roller 152 in response to a print instruction from the host computer. The MPU 116 supplies the paper switch signal s2 to the high-voltage power-supply unit 200 for a thick paper. The MPU 116 supplies the environment switch signal s4 to the high-voltage power-supply unit 200 when judging that the transfer environment is a special environment based on a detection result of a humidity sensor (not shown) or the like. Paper supply sensor 153 detects whether a printing paper is drawn from the first paper-supply unit 103. The printing paper is then fed to the feed roller 154 in an upper direction.

After the resist sensor 158 detects a top of the printing paper, the printing paper continues to be fed until its top reaches the resist roller 156. This feed amount has been simulated using detection by the resist sensor 158 and stored in the memory. Thereby, the paper slant can be corrected. Then, the printing paper is fed by the resist roller 156 and reaches the transfer position. Then, the transfer unit 280 transfers a toner image formed by the print unit 250. The MPU 116 controls the transfer current applied by the transfer unit 280 as described above.

The printing paper onto which the toner image is transferred is fed to the fixture unit 290 by the resist roller 156, whereby the heat and pressure fix the toner image is fixed onto the printing paper. The fixture unit 290 may employ any known structure, and includes heat and pressure rollers 292 and 294 in this embodiment.

The heat roller 292 includes an internal heat source, and is rotated by a drive motor (not shown). The pressure roller 294 supports its rotary shaft using an elastic member such as a coil spring, and compresses the heat roller 292 by a predetermined pressure using the tension force of the elastic member. The pressure roller 294 is constituted as a subordinate roller which rotates along with the heat roller 292.

The heat roller 292 transmits heat to the pressure roller 294 so that the temperature of the pressure roller 294 approaches the surface temperature of the heat roller 292. Heat from the rear surface of the printing paper achieves an efficient fixture. A width of each of the heat and pressure rollers 292 and 294 is set to be longer than the paper width in the feed direction that the printer 100 may handle, for example, 297 mm for A3 sized paper. Heat and pressure soften toner and fix a toner image onto the paper that is held between the heat and pressure rollers 292 and 294. First and second eject rollers 302 and 304 eject the fixed paper up to the stacker 110.

The transfer unit 280 may employ a roller transfer method as disclosed in Japanese Patent Application No. 4-156805, which applies voltage to a roller using an electroconductive rubber, holds the paper with the photosensitive drum using pressure, and transfers onto the paper a toner image formed on the photosensitive drum.

The printer 100 may use the double-sided print unit 102 for the double-sided printing. The front surface of a printing paper is printed as with the above single-sided printing, and the first and second eject rollers 302 and 304 feed the printing paper until its end passes gate 306. The gate 306 is forced so that it shields the feed path from the fixture 290 to the stacker 110. Then, the gate 306 is rotated so that the feed path from the fixture unit 290 to the stacker 110 may open and the paper may passes the gate 306.

When the paper end passes the gate 306, the gate 306 rotates and returns so as to shield the feed path from the fixture unit 290 to the stacker 110. Whether the paper end passes the gate 306 is recognized by a feed of the paper by the predetermined amount (which is obtained by simulation which measures an actual feed of the printing paper) after the sensor 308 detects the paper end.

The first and second eject rollers 302 and 304 rotate in the reverse direction as the paper end passes the gate 306. The printing paper fed in the reverse direction is carried to the double-sided print unit 102 via the gate 306. Then, double-sided feed and pick rollers 146 and 148 feed the printing paper to the resist roller 156. When the printing paper is fed to the resist roller 156, its rear surface is printed in an operation similar to the single-sided printing. In the rear surface printing, the MPU 116 generates the surface switch signal s3 shown in FIG. 8 and supplies it to the high-voltage power-supply unit 200. After the double-sided printing, the first and second eject papers 302 and 304 eject the printing paper up to the stacker 110.

Figure 11:
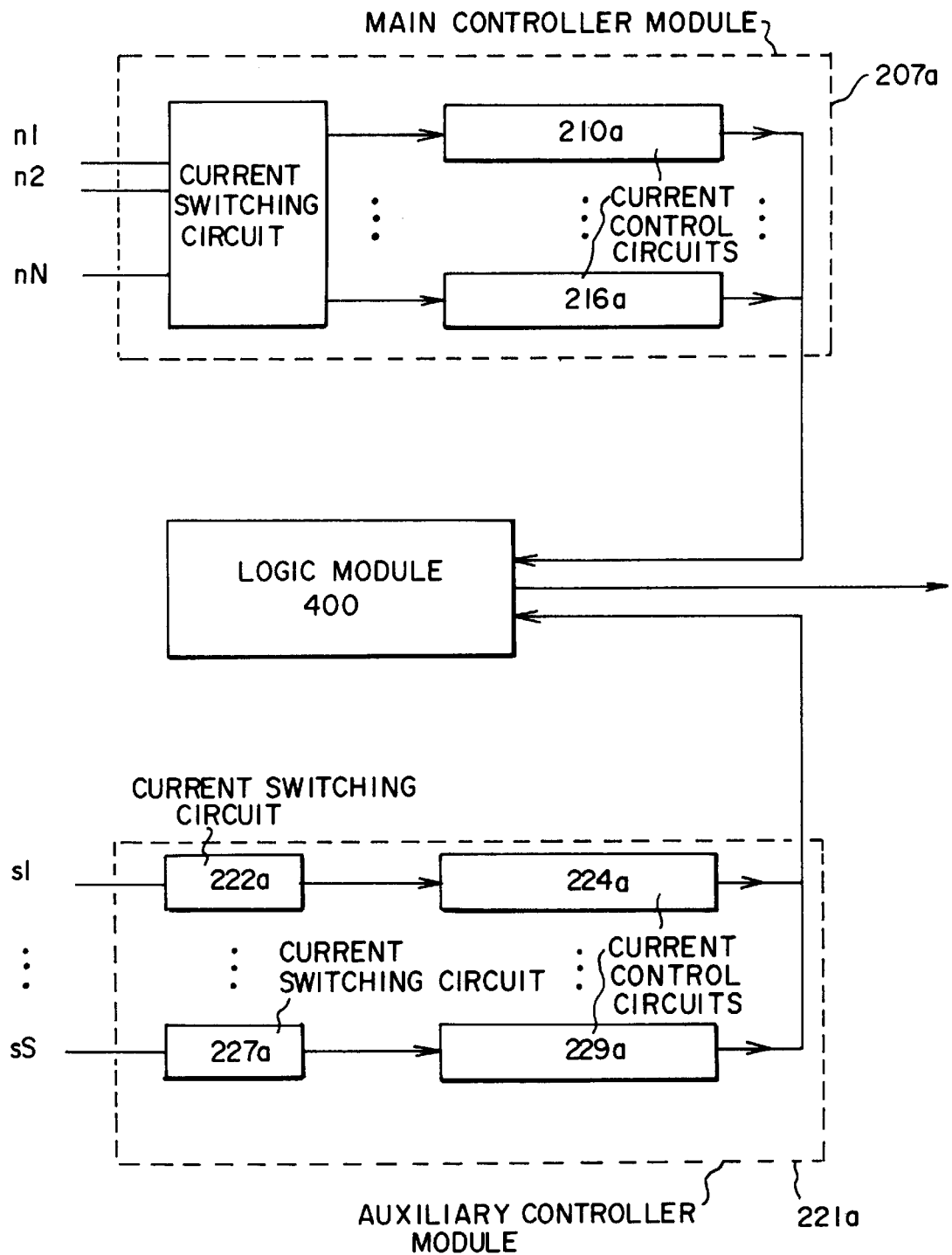
FIG. 11 is a block diagram of another example according to the present invention.

Further, the present invention is not limited to these preferred embodiments, but various variations and modifications may be made without departing from the scope of the present invention. For example, as shown in FIG. 11, the control device of the present invention may include logic (operation) module 400 that receives outputs from main controller module 207a and auxiliary controller module 221a, and performs an arbitrary logic operation process. The main controller module 207a is connected to a plurality of signal lines n1 through nN and includes a plurality of current control circuits 210a through 216a. The auxiliary controller module 221a is connected to a plurality of signal lines s1 through sS and includes a plurality of current control circuits 224a through 229a. A logic operation that the logic module 400 performs is not limited to a wired OR shown in FIGS. 6 and 9, but may include an arbitrary operation such as the subtraction and multiplication. The logic module 400 may perform the similar effects according to the present invention. Since those skilled in the art may easily conceive a logic circuit for use with the logic module 400, a description thereof will be omitted.

As discussed, the transfer output device, and high-voltage power-supply unit, and printer according to the present invention may provide a transfer current value which may elastically treat various parameters including the printing-paper feed speed and types. Such a transfer output device has a relatively simple circuit arrangement, thereby preventing a printer from becoming expensive.

The control device according to the present invention is well suitable for but not limited to a control over the transfer current in the transfer unit in a printer, and broadly applicable to current, voltage and other various control objects in addition to the transfer current.

What is claimed is:

1. An output circuit which controls a current, said circuit comprising:
   a main controller module connected to a first signal line;
   an auxiliary controller module connected to a second signal line;

an oscillator module connected to said main and auxiliary controller modules; and a transformer module connected to said main and auxiliary controller modules and oscillator module, wherein said main controller module includes:
  a first current-switching circuit which receives a first signal through the first signal line; and
  a plurality of first current control circuits each of which is selected by the first current-switching circuit based on the first signal, and outputs a first value,
  the number of first current control circuits being $2^m$ where the number of the first signal lines is m, wherein said auxiliary controller module includes:
  a second current-switching circuit which receives a second signal through the second signal line; and
  a second current control circuit which is selected by the second current-switching circuit based on the second signal, and outputs a second value, and
  wherein where the number of first and second signal lines is n, the number of the second current control circuits is s, and s=n−m, the number of first and second current control circuits is ($2^{n-s}$+s), the transformer module consequently being able to generate and output $2^n$ currents using a combination of the first and second values.

2. A high-voltage power-supply unit comprising:

a transfer output circuit which controls a transfer current applied to a transfer unit in order to print a predetermined image on a printing paper; and a pre-charger output circuit which controls a pre-charger, wherein said transfer output circuit including:
  a main controller module connected to a first signal line;
  an auxiliary controller module connected to a second signal line;
  an oscillator module connected to the main and auxiliary controller modules; and
  a transformer module connected to the main and auxiliary controller modules and the oscillator module,
  wherein the main controller module includes:
    a first current-switching circuit which receives a first signal through the first signal line; and
    a plurality of first current control circuits each of which is selected by the first current-switching circuit based on the first signal and outputs a first value,
    the number of first current control circuits being $2^m$ where the number of the first signal lines is m,
  wherein said auxiliary controller module includes:
    a second current-switching circuit which receives a second signal through the second signal line; and
    a second current control circuit which is selected by the second current-switching circuit based on the second signal, and outputs a second value,
    wherein where the number of first and second signal lines is n, the number of the second current control circuits is s, and s=n−m, the number of first and second current control circuits is ($2^{n-s}$+s), the transformer module being consequently able to generate and output $2^n$ transfer currents using a combination of the first and second values, and
  wherein said pre-charger output circuit receives a signal indicative of a feed speed of the printing paper, and generates pre-charge voltage applied to the pre-charger, the second signal including the signal indicative of the feed speed.

3. A printer comprising:

a photosensitive body;

a transfer unit which transfers onto a printing paper a toner image that has been formed on said photosensitive body; and a transfer output circuit which controls a transfer current applied to said transfer unit, wherein said transfer output circuit includes:
  a main controller module connected to a first signal line;
  an auxiliary controller module connected to a second signal line;
  an oscillator module connected to the main and auxiliary controller modules; and
  a transformer module connected to the main and auxiliary controller modules and the oscillator module,
  wherein the main controller module includes:
    a first current-switching circuit which receives a first signal through the first signal line; and
    a plurality of first current control circuits each of which is selected by the first current-switching circuit based on the first signal, and outputs a first value,
    the number of first current control circuits being $2^m$ where the number of the first signal lines is m,
  wherein said auxiliary controller module includes:
    a second current-switching circuit which receives a second signal through the second signal line; and
    a second current control circuit which is selected by the second current-switching circuit based on the second signal, and outputs a second value, and
    wherein where the number of first and second signal lines is n, the number of the second current control circuits is s, and s=n−m, the number of first and second current control circuits is ($2^{n-s}$+s), the transformer module being able to generate and output $2^n$ transfer currents using a combination of the first and second values.

4. A control method comprising the steps of:

reading out, while referring to a set table, control value based on a control instruction including first and second parameters, the set table including the first and second parameters, the first parameter including $2^m$ types of first elements, and the number of types of second parameter being s each of which includes two types of second elements; and identifying the first and second elements corresponding to the control value and set the first and second elements as first and second signals respectively, wherein the first signal is supplied to a main controller module including $2^m$ first control circuits through m first signal lines, while the second signal is supplied to an auxiliary controller module including s second control circuits through s second signal lines.

5. A mechanical-part control circuit module comprising:

a memory which stores a set table including first and second parameters, the first parameter including $2^m$ types of first elements, and the number of types of second parameter being s each of which includes two types of second elements;

a processor which not only reads out a control value based on a control instruction including the first and second parameters while referring to the set table stored in said memory, but also identifies the first and second elements corresponding to the control value, thereby setting the first and second elements as first and second signals respectively, wherein said mechanical-part control circuit module is connected to main and auxiliary controller modules, wherein the first signal is supplied to the main controller module including $2^m$ first control circuits through m first signal lines, and the second signal is supplied to the auxiliary controller module including s second control circuits through s second signal lines, whereby the main and auxiliary controller modules output the control value based on the first and second signals.

6. A mechanical-part control circuit module according to claim 5, wherein said processor is connected to a sensor that detects an environment, and an output of the sensor constitutes the second parameter.

7. A control device comprising:

a main controller module connected to a first signal line; and an auxiliary controller module connected to a second signal line;

wherein said main controller module includes:
 a first switching circuit which receives a first signal through the first signal line; and
 a plurality of first control circuits each of which is selected by the first switching circuit based on the first signal, and outputs a first value, the number of first control circuits being $2^m$ where the number of the first signal lines is m, wherein said auxiliary controller module includes:
 a second switching circuit which receives a second signal through the second signal line; and
 a second control circuits which is selected by the second switching circuit based on the second signal, and outputs a second value, and wherein where the number of first and second signal lines is n, the number of the second control circuits is s, and s=n−m, the number of first and second control circuits is ($2^{n-s}$+s), said control device being consequently able to generate and output $2^n$ combinations of the first and second values.

8. A control device according to claim 7, wherein outputs of said main and auxiliary controller modules are connected by a wired-OR manner to each other.

9. A control device comprising:

a main controller module connected to a first signal line;

an auxiliary controller module connected to a second signal line; and a logic module connected to said main and auxiliary controller modules, said logic module performing a predetermined operation for outputs of said main and auxiliary controller modules, wherein said main controller module includes:
 a first switching circuit which receives a first signal through the first signal line; and
 a plurality of first control circuits each of which is selected by the first switching circuit based on the first signal, and outputs a first value, the number of first control circuits being $2^m$ where the number of the first signal lines is m, wherein said auxiliary controller module includes:
 a second switching circuit which receives a second signal through the second signal line; and
 a second control circuit which is selected by the second switching circuit based on the second signal, and outputs a second value, and wherein where the number of first and second signal lines is n, the number of the second control circuits is s, and s=n−m, the number of first and second control circuits is ($2^{n-s}$+s), said logic module being consequently able to generate and output $2^n$ combinations of the first and second values.

* * * * *